United States Patent [19]
Yenni, Jr.

[11] Patent Number: 6,013,376
[45] Date of Patent: Jan. 11, 2000

[54] METAL FIBERMAT/POLYMER COMPOSITE

[75] Inventor: Donald M. Yenni, Jr., Round Rock, Tex.

[73] Assignee: 3M Innovative Properties Company, St. Paul, Minn.

[21] Appl. No.: 08/987,336

[22] Filed: Dec. 9, 1997

[51] Int. Cl.[7] ..................................................... B32B 15/08
[52] U.S. Cl. .......................... 428/458; 428/457; 428/688; 428/174; 428/294.4
[58] Field of Search ..................................... 428/457, 458, 428/459, 465, 480, 484, 689, 688, 174, 294.4; 264/510

[56] References Cited

U.S. PATENT DOCUMENTS

| | | | |
|---|---|---|---|
| 3,727,292 | 4/1973 | Nicely | 29/419 |
| 4,532,099 | 7/1985 | Kaji | 264/510 |
| 4,678,699 | 7/1987 | Kritchevsky et al. | 428/175 |
| 4,689,098 | 8/1987 | Gaughan | 156/62.2 |
| 5,089,326 | 2/1992 | Bonazza | 428/284 |

FOREIGN PATENT DOCUMENTS

| | | | |
|---|---|---|---|
| 0 323 642 A2 | 7/1989 | European Pat. Off. | B32B 27/12 |
| 0 369 639 A2 | 5/1990 | European Pat. Off. | B32B 15/02 |
| 0 396 957 A2 | 11/1990 | European Pat. Off. | C08J 5/04 |
| 0 529 801 A1 | 3/1993 | European Pat. Off. | H05K 9/00 |
| WO 97/22234 | 6/1997 | WIPO . | |

*Primary Examiner*—William Krynski
*Assistant Examiner*—Hong J. Xu
*Attorney, Agent, or Firm*—Darla P. Fonseca

[57] ABSTRACT

A shaped article having EMI shielding properties, having been shaped by thermoforming of a planar sheet, and having a shape requiring the planar sheet to exhibit a stretch ratio of at least about 300%, and up to about 500%. The article consists essentially of a fibrous metal mat substantially surrounded by a fiber-coat and a polymeric carrier for support of the mat. The fiber mat may also be embedded into the carrier material. The fiber-coat may be sprayed onto the mat or, as a thermoplastic material, may be forced together with the metal fiber mat to surround it, and such procedure may take place before or after attachment to the carrier material.

16 Claims, No Drawings

METAL FIBERMAT/POLYMER COMPOSITE

BACKGROUND OF THE INVENTION

1. Field of the Invention

This invention provides improved non-woven mats of randomly oriented, low melting, metal fibers, for use in metal/polymer composites, and particularly for shaped metal/polymer composites.

2. Description of the Related Art

A variety of composites containing both metal and polymeric materials are known for use in many varied applications. Composites may include metal in the form of continuous sheet, perforated sheets, mesh, woven screen or non-woven webs of randomly distributed fibers. Similarly, polymer structures, combined with the various forms of metal, may include films, sheets, perforated sheets, woven material or non-woven layers with random fiber distribution. One important use for a metal/polymer composite is as a shield for electromagnetic and radio frequency waves. The interference caused by such waves in electronic devices is commonly referred to as electromagnetic interference (EMI) or radio frequency interference (RFI), hereinafter jointly referred to as EMI. EMI shielding is often placed around an EMI source to prevent it from radiating EMI and interfering with surrounding devices. Also, the devices themselves may be provided with EMI shielding in an effort to shield the device from incoming electromagnetic radiation.

Effective EMI shielding requires the formation of a uniform conductive enclosure around the EMI-sensitive or EMI-emitting device. A shielding layer, associated with the conductive enclosure, may be in the form of a continuous layer or a discontinuous grid, such as a metal mesh. Any enclosure formation process that significantly increases the maximum void dimension in the shielding layer, sometimes called the "slot effect", could cause faulty EMI shielding performance of the shielding material.

Previous disclosures reveal ways of producing and shaping sheet material that has EMI shielding capability, typically using an electrically conducting layer, which are required in many applications.

For example U.S. Pat. No. 3,727,292, (Nicely), discloses a non-woven unitary metallic sheet which is fabricated by extruding a molten stream from a metallic melt into an atmosphere which reacts to form a stabilizing film about the periphery of the metal stream. The spun metal filaments are allowed to solidify, and then collected as a nonwoven fibrous mass. The mass of filaments is then compressed into a sheet-like form, and given strength by binding all or selected adjacent fibers together.

U.S. Pat. No. 4,689,098 (Gaughan) discloses an EMI shielding sheet comprising a layer of nonwoven reinforcing fibers which supports a layer of metal whiskers or fibers formed from a ductile metal or metal alloy. Metal layer formation disclosed in U.S. Pat. No. 3,272,292 (Nicely) applies to U.S. Pat. No. 4,689,089 which provides a stampable EMI shielding sheet. Another stampable EMI shielding construction appears in U.S. Pat. No. 4,678,699 (Kritchevsky et al). This patent notes that, "The shielding layer must be able to maintain its shielding effectiveness upon stamping." Such a statement reflects the fact that stamping processes tend to disrupt fibrous networks, breaking the fibers which, in the case of EMI shielding, results in poorer shielding effectiveness of the metal layers.

Stamping is one method for forming shaped EMI shielding structures. This forming technology was developed in the metal industry for forming thin metal objects. It involves rapid, almost instantaneous application of mechanical force to distort a sheet into a shaped object. Stampable plastic/metal composite sheets may require heating, to soften the plastic surrounding the metal shielding layer, prior to stamping. This reduces the modulus of the plastic, allowing it to flow while the metal shielding composite responds to the high pressure, shaping force of the stamping press. The speed of this process demands high levels of ductility for the metal and high plasticity for the remainder of the composite, to absorb the applied force without rupture. This method, applied to sheet molding compound (SMC), provides automotive body panels and business machine housings using reinforced material comprising a non-woven, glass-fiber reinforcing layer, and a mat containing conductive fibers for EMI shielding, held together with a resin such as polyester. The SMC is a flat sheet prior to forming in compression dies of high tonnage presses. Material properties limit the use of SMC to simple, relatively shallow shapes. Conditions used for sharp draws, e.g. multiple rib formation in the shaped panel, may cause ripping of the shielding layer and reduction of EMI shielding performance.

As a substitute for stamping, the use of thermoforming or injection molding may be considered. Thermoforming, as it relates to the present invention, comprises heating a sheet and forming it into a desired shape. The process includes heating a thermoplastic composite sheet above its softening point, then using either air pressure or vacuum to deflect the sheet towards the surface of a mold until the sheet adopts the shape of the mold surface. Upon cooling, the sheet sets in the required shape allowing removal from the mold.

European patent EP 529801, commonly assigned with the instant application, discloses EMI shielding, add-on sheets, comprising carrier material with a metal fiber mat at least partially embedded in the carrier material. The add-on sheets provide EMI shielding to selected parts of a thermoformed structure. Successful use of these add-on sheets requires that they possess or develop porosity when thermoformed in contact with the thermoformable substrate blank to which they were applied.

Depending on the melting point of the metal fibers in the EMI shielding layer, it is possible for individual fibers to melt and rupture under stress, such as during stretching and shaping, with resulting protrusions or "bumps" of metal at the point of separation. This can adversely affect EMI shielding efficiency due to increased size of voids in the shielding layer, after thermoforming. In addition, metal bumps may form as conductive projections from the surface of the shielding layers in electronic housings. Such projections cause potential electrical shorting problems if they contact circuit elements or microdevices in the restricted space usually associated with electronic packages. Also bumps may adversely affect injected resin flow when the shielding composite is an insert for injection molding.

Several alternative solutions have been attempted to improve the effectiveness of conductive fiber based EMI shielding. The formation of pressure welds or sintered bonds between the fibers improves electrical conductivity, but reduces overall flexibility and extensibility of the welded mat. Composite metal-fiber/polymer sheets containing such sintered metal mats cannot be thermoformed without breaking many of the fibers themselves, the bonds between the fibers or both, thus drastically reducing the shielding properties at the higher stretch ratios commonly required in thermoformed parts.

With the increasing use of advanced, EMI-sensitive electronics, a need exists for improved materials for shaping into EMI shielding housings that reliably protect electronic packages. Methods to shape EMI shielding structures rely upon the use of moldable composites with ability to retain shielding capabilities even when complex shapes demand localized elongation of 300–500%. This condition is possible using composite structures of the invention comprising a thermoplastic sheet of carrier material supporting a layer of randomly distributed, low melting metal fibers stabilized against fiber rupture and formation of bumps during forming by means of a coating (fiber-coating) of a thermoplastic polymer. Composite sheets of the invention provide improved EMI shielding performance by maintaining the integrity of molten metal strands during thermal shaping involving deep drawing of the composite sheet.

SUMMARY OF THE INVENTION

The present invention provides a composite, thermoformable planar structure combining a non-porous carrier sheet with a mat or grid of randomly oriented, low melting metal fibers. The metal fibers are substantially surrounded by a thermoplastic coating material, which may be coated prior to or after attachment of the metal fibers to the non-porous sheet.

The invention further provides a shaped article having EMI shielding properties, having been shaped by thermoforming of a planar sheet, and having a shape requiring the planar sheet to exhibit a stretch ratio of at least about 300%. The article consists essentially of a fibrous metal mat substantially surrounded by a fiber-coat and a polymeric carrier for support of the mat. The fiber mat may also be embedded into the carrier material. The fiber-coat may be sprayed onto the mat or, as a thermoplastic material, may be forced together with the fibrous metal mat to surround it, and such procedure may take place before or after attachment to the carrier material.

In preferred thermoformable structures, the melting point of the metal fibers is lower than the softening points of either the non-porous sheet material or the fiber-coat material. At thermoforming temperatures, the viscosity of the softened fiber-coat material is higher than the viscosity of the molten metal of the metal fiber grid. All components of the composite melt or soften at temperatures lower than the temperature of thermoforming. The EMI shielding sheet exhibits improved performance, particularly when formed into deep-drawn shapes with pockets having stretch ratios up to 500%.

The resulting composite sheet material may itself be thermoformed or may be an integral portion of an injection molded structure when placed, as a planar sheet, or preform, into the molding cavity prior to resin injection.

All of the various embodiments of the invention require coating of the strands of the fibrous metal mat. This leads to the improvements associated with the invention including reduction or prevention of flaking of the metal fibers during handling and essential absence, at elevated temperature, of fiber rupture and metal bumping-up at the rupture point, and separation of the molten fiber. Lack of disruption of the fibrous metal mat means improved retention of EMI shielding for composite sheets of the invention.

As used herein, there terms have the following meanings.

1. The terms "fiber-coat" and "fiber-coat matrix" are synonymous as used herein to refer to that coating or material which substantially surrounds the metal mat, providing stabilization thereto, in order to reduce displacement.

2. The term "carrier sheet" means a layer which is attached, by various means, including mechanical means, heat attachment, adhesive attachment or the like, to the metal mat and fiber-coat. The term "carrier material" is synonymous.

3. The term "melting point" as applied to a metal means that point at which the metal begins to become molten, i.e., the melt onset. The metal is not completely melted at this point.

4. The term "softening point" of a polymer is that point at which the polymer begins to change state from solid to liquid; however, it is not fully liquefied.

5. The term "slot effect" refers to the phenomenon that the amount of EMI that passes through a given void is dependent on the length of the void's longest dimension and not on the total area of the void, such that a very long thin void may pass much more EMI through than a square void with smaller dimensions having many times the area of the thin void.

6. A "bump" is a protrusion formed from flowing of the metal fiber when molten. The protrusion can result in disruption of EMI shielding, electrical shorting problems if there is contact with circuit elements or microdevices in the restricted space usually associated with electronic packages.

7. The terms "fibrous metal mat" and "metal fiber mat" are synonymous and mean a mat formed from metal filaments.

All percentages, parts and ratios herein are by weight unless specifically noted otherwise.

DETAILED DESCRIPTION OF THE INVENTION

Electromagnetic interference (EMI) shielding of electronic devices requires, in the majority of cases, a material that blocks the interference signals associated with the devices themselves or impinging from external sources that radiate potentially damaging electromagnetic waves. Effective materials must meet EMI shielding requirements while responding to shape formation using a variety of molding techniques. EMI shielding articles herein depend on the use of an electrically conductive, randomly oriented fibrous metal mat comprising a low melting metal or metal alloy, melting in a temperature range from about 70° C. to about 370° C. Within this temperature range, fibers in the fibrous metal mat become molten as required during thermoforming processes related to this invention.

Unfortunately, in such molten condition, the influence of surface tension, creates a tendency for the metal to flow. This flow disrupts the filamentary form of the fibers. Consequently, unconstrained, a molten metal fiber is susceptible to either thickening or separation, both of which can generate "bumps". A thickened fiber may exhibit a spheroidal "bump" in its length with thinned sections of fiber on either side of the bump. When fiber separation occurs, the molten ends of fiber, at the point of rupture, will form a bump and produce a gap in the length of the fiber. Both fiber thinning and gaps reduce EMI shielding effectiveness of the metal fiber mat. Avoidance of these conditions provides the improvement that distinguishes the present invention from other EMI shielding articles.

Fiber thinning and gap formation may be substantially eliminated by constraining molten metal fibers in a form as similar as possible to that of the solid fibers. This may be accomplished by surrounding the fibers with a fiber-coat material, which limits the ability of the fibers to form bumps and gaps. As the fiber-coat and metal fiber mat change shape during thermoforming, the fiber-coat matrix stabilizes the molten metal fiber and limits its flow. Suitable materials for the fiber-coat include thermoplastic, film forming polymers which have a softening point below the highest temperature reached in the thermoforming process, but higher than the melting point of the fibrous metal mat.

While not wishing to be bound by theory, it is believed that the fiber-coat provides channels or passageways that maintain metal fibers in filamentary form while molten, during thermoforming. Channel or passageway formation is accomplished by varied methods, depending on the nature of the carrier material. For example, a non-porous, thermoplastic carrier sheet may be softened then combined with the mat of metal fibers by embedding the mat into the carrier material until substantially covered. One method to provide suitable composite sheets includes heating the carrier material to a softened condition and laminating the mat and carrier together. Alternatively, the fibrous metal mat may be first coated with the thermoplastic fiber-coat by such mechanisms as softening of a solid coat, spraying of a liquid coat and the like, and then the coated mat may be attached to the carrier layer, by means of adhesive, or of forcing the layers together or other conventional means. The extent of burying of the coated metal fiber mat depends upon the thickness of the fiber-coat, and the form in which it is applied. Any of the composite sheets, previously described, may be molded directly without significant disruption of the EMI shielding layer, due to the non-porous nature of the carrier material. Where a thick article is desired, the carrier layer can be provided with a further "backing layer", which may be the same or different.

Examples of polymeric materials useful as carrier materials, fiber-coats and backing layers, include, but are not limited to, ethylene-butyl acrylate copolymers, ethylene-vinyl acetate copolymers, ethylene-methacrylic acid copolymers; thermoplastic polyesters, e.g., "6763 PETG", available commercially from Eastman Chemical, "Bynel CXA" resins, available commercially from E.I. duPont de Nemours (DuPont); "DAF" 801, and "DAF 919", available commercially from Dow Chemical Company; polyamides, or blends thereof, acrylic adhesives, hot melt adhesives, block copolymers, polyurethanes, polyethylenes, polypropylenes, grafted polymers and copolymers, functionalized copolymers, maleic anhydrides, acrylic acid modified copolymers, polyesters, copolyesters, latex binders, polyurethane dispersions, styrene-ethylene butylene-styrene copolymers, available from Shell as Kraton® resins, EVA dispersions, paraffin wax, and the like. While typically the fiber-coat and the carrier sheet material will differ to provide desired properties in the final shaped article, they could be the same if desired.

Polymers useful as backing layers include such polymers as acrylonitrile, butadiene styrene, polycarbonate, cellulosic materials, and the like.

These polymers and copolymers may also contain fillers such as glass microspheres, which are especially useful when acrylic adhesives are used, colorants, antioxidants, dyes, and the like in small percentages such as will not disturb the electrical performance or EMI shielding properties of the article.

A wide variety of metals and metal alloys may be used in EMI sheets of the invention. A useful metal has a melting temperature in the range of 70° C. to about 370° C. depending on the carrier polymer. Metals having the appropriate melting temperatures must be selected by one skilled in the art so that the carrier polymer will not degrade at the thermoforming temperatures required for the article. Examples of relatively low melting metals for use in composites of the present invention include tin, lead, bismuth, cadmium, indium, gallium, zinc, mixtures thereof, and their alloys. The alloy group may be augmented by alloys containing metals with higher melting points, including such metals as antimony, aluminum, copper, silver, gold, nickel, cobalt, and iron. Those skilled in the art will also be able to select other alloys to fulfill the requisite melt temperature criterion.

Thermoforming procedures used with improved EMI shielding, composite sheets of the invention do not include high impact methods such as forceable stamping even if the stamping proceeds at elevated temperature. Instead, the preferred method employs a clamping frame that holds the composite sheet for exposure to heating devices or ovens located on either side of the sheet. After absorbing heat, sufficient to suitably soften the composite sheet, and moving the frame to effect a seal between the softened sheet and the mouth of a shaping mold, the application of vacuum to the mold draws the composite sheet into the mold until there is intimate contact between the sheet and the mold surface. While this method uses vacuum to draw the sheet into the mold, it is possible to use external air pressure to urge the sheet into the mold and into contact with the mold surface as before. Also, the female mold used in the example may be replaced by a male mold suitably designed for either pressure or vacuum forming.

During shaping, by thermoforming, sections of the sheet become significantly stretched requiring elevated temperature elongation of from about 300% to about 500% by the metal mat and the carrier material. This places a strain on the integrity of the metal fibers which lose EMI shielding capability if they rupture. However, in articles of the invention, the molten metal fiber, surrounded by or substantially embedded in a thermoplastic fiber-coat shows almost no tendency to flow and form bumped or broken fibers. As the metal mat is stretched, the molten metal strands, stabilized by the fiber-coat matrix, retain continuity. Metal fiber-to-fiber contacts not only remain intact but, as the fiber-coat stretches they are fused together, to improve the performance of the EMI shield.

Even with a coating over fibers of the metal mat, electrical continuity between the EMI shielding layer and e.g., a ground plane of a printed circuit, may be established using special connection techniques, such as heat staking and sonic welding to access the metal layer. Any method may be used for electrical connection, between the EMI shielding layer and associated structures, provided it displaces polymer to expose bare metal fiber. As an example, heat staking temperatures are such that polymer melting occurs allowing metal fiber, under the influence of pressure, to penetrate and push aside the overlying polymer.

The benefits of EMI shielding composite sheets of the invention may be extended to other applications following the discovery that the planar sheets or thermoformed preforms, made therefrom, can provide EMI shielding to injection molded articles. For this purpose, the EMI shielding structure, either in sheet form or thermoformed preform, is inserted in the mold prior to injecting the molding resin. This provides a layer of EMI shielding material as part of the injection molded structure.

The invention is further understood by reference to the following non-limiting examples.

Experimental—Composite Sheet Formation

Samples of EMI shielding material, made according to the following examples, were evaluated by thermoforming to the same shape, under the same shaping conditions. In particular the samples were inspected, during the thermoforming process, for evidence of formation of bumps on metal fibers or metal beads at fiber fracture sites. Both conditions are undesirable for the reasons indicated previously.

Metal Fiber Mat Preparation

Fabrication of a non-woven metallic sheet involves the steps of extruding a molten stream from a metallic melt, distributing the stream on a planar surface as a randomly oriented mat of metal fibers, taking care to avoid fusion between fibers at points of intersection and thereafter allowing the metal mat to cool.

Metal Fiber Mat A

Metal fiber mat A, contains randomly oriented metal fibers, formed as previously described. The fibers comprise tin/bismuth alloy fibers weighing about 650 g/M$^2$ and melting at 138° C.

Polymer Fiber Mat B

Fiber mat B, used in comparative Example 1, is a melt-blown, non-woven, polymer web formed using a 50:50 blend of ethylene vinyl acetate copolymers VYNATHENE EY 902-30 (available from Quantum Chemical Corp.) and ESCORENE 7520 (available from Exxon Chemical Co.). The resulting melt-blown web weighs about 160 g/M$^2$.

COMPARATIVE EXAMPLE 1C

Metal fiber mat A was formed directly on a surface of polymer fiber mat B to provide a composite combining a metal fiber layer with a blown microfiber polymer layer. The composite was protected on either side by several sheets of silicone release paper and pressed for 5 seconds in a platen press operating at a temperature of about 70° C., under a load of 341–454 kg to partially drive the metal fibers into the polymer layer. Multiple layers of release paper protect the metal fibers from sintering and distortion, both of which may adversely affect the EMI shielding effectiveness of subsequently thermoformed structures.

The resulting composite structure of Example 1 was porous due to the combination of an unprotected, randomly oriented metal layer with a melt blown polymer web. Porous structures cannot be thermoformed, as described below, because air passes through the sheets preventing deflection of the softened sheet during application of vacuum or air pressure. Therefore, this comparative sample was combined with a continuous sheet of 0.25 mm polycarbonate backing prior to the thermoforming operation. Inspection of the metal fiber mat after thermoforming revealed evidence of bump formation and fiber separation because the metal fibers were not substantially surrounded by a fiber-coat.

EXAMPLE 2

Fiber mat A was formed directly on a surface of a sheet of 0.25 mm thick polycarbonate (LEXAN 8010MC from GE Plastics-Structured Products). A 0.20 mm thick film of ethylene vinyl acetate (BYNEL E 418 available from E.I. DuPont de Nemours), extruded at 235° C. over the top of the metal fibers, sealed them between polymer layers. The resulting composite then passed through a gap of about 0.50 mm formed by nip rollers operating at 121° C. A silicone release cover, over the roller contacting the BYNEL side of the composite, prevented sticking at the interface.

EXAMPLE 3

A 0.64 mm thick film of ethylene vinyl acetate (DUPONT ELVAX 350) was extruded at 177° C. onto metal fiber mat A, which was supported by a silicone belt. The two materials were joined by passing them through chrome plated steel nip rollers. A 20 cm×20 cm sample of the resulting composite was placed metal fiber side up onto a 30 cm×30 cm sheet of 0.26 mm thick sheet of LEXAN 8010MC polycarbonate (obtained from GE Plastics-Structured Products). This composite was pressed together in a platen press heated to 100° C. at 455 kg for 10 seconds. The resulting composite comprises a polycarbonate carrier base, an intermediate layer of Elvax 350 and a top layer of tin bismuth fibers substantially embedded into the surface of the Elvax 350.

EXAMPLE 4

Two sheets of acrylic adhesive were prepared as follows: 3M acrylic adhesive RD20789 (available from 3M), was mixed with 1.2% by weight of 30 micron diameter silver coated glass spheres obtained from Potters Industries, Inc., Parsippany, N.J. This mixture was coated onto a sheet of release liner using a notched bar coater at a wet thickness of 0.26 mm. After drying the adhesive layer sheets, one was laminated onto a 0.13 mm thick sheet of LEXAN 8010MC polycarbonate (obtained from GE Plastics-Structured Products) measuring 30 cm×30 cm, by placing the adhesive side of one of the sheets against the polycarbonate, pressing it down from the release liner side and then peeling off the release liner to transfer the adhesive layer to the polycarbonate sheet. A layer of Mat A was then placed on top of the adhesive layer. The second adhesive layer was then applied to metal fiber mat A, as described previously, producing a metal layer sandwiched between layers of conductive adhesive. This composite was placed between multiple sheets of release liner to pad the material prior to pressing in a platen press set at 455 kg load for 20 seconds at 100° C.

The Process of Thermoforming

Thermoforming, especially associated with the present invention, refers to the process that combines a shaping mold, heat and either pressure or vacuum to change a planar sheet of softened, thermoplastic material into a contoured structure which, on cooling, substantially replicates the shape of the mold. Equipment for the basic forming method includes parallel acting frames, to hold the thermoplastic sheet; heaters above and/or below the sheet-stock to be softened; molds, either male or female, to provide the shape against which the softened sheet will be thermoformed; and equipment for increasing or reducing air pressure to deflect the softened sheet-stock for shaping.

Thermoformed Sample Preparation

Composite sheets of the invention had a planar structure before shaping in a thermoformer having a centrally positioned clamping system to hold a sheet between heaters positioned above and below the clamping station. Heating of a composite sheet may use either one of the heaters or both together. Examples 1–4 used only the lower heater operating at a temperature of 538° C. Sheets were exposed to this temperature for about 0.5 minute.

Each of the composite sheets of Examples 2 and 3 already included a layer of 0.25 mm thick polycarbonate while Example 4 included a 0.13 mm polycarbonate.

After softening, a sheet was positioned in close proximity to the shaping mold by moving the clamping structure. The thermoformed sample, used for evaluation, was a cylindrical bowl having a flat, circular base of 17.6 cm diameter with a circular wall extending 4.1 cms vertically from the base. With the sheet and clamping structure suitably positioned to form an air-tight seal with the upper edge of the circular wall of the mold, vacuum was applied to draw the sheet into the mold until the surface of the sheet was in close contact with the mold wall. This shaping required significant stretching of the composite sheet between the upper edge of the circular wall and the juncture between the wall and the base. After cooling the composite material adopted the shape of the cylindrical bowl.

Metal fiber stretching is at a maximum in the corner formed by the circular wall and the base portion of the bowl-shaped composite material. This portion is therefore most subject to fiber rupture and separation during thermoforming. When the fibers become molten, extension of the metal strands is limited only by the surface tension of the molten metal. Any means to preserve the molten metal in the form of a fiber will improve potential fiber elongation. This is demonstrated by the results of forming the composite sheets of Examples 1–4, described below and presented in Table 1.

In thermoformed bowl preparation, there was a very significant difference between Comparative Example 1, using a metal mat without polymer overcoating, and the other examples involving metal mats either substantially embedded in a polymer layer or having a polymer overcoat applied. Evidence of poorer performance of Example 1 was the appearance, during thermoforming of the composite sheet, of metal beads by either thickening of individual metal strands or metal bead formation by fiber separation. As the metal beads grow, they gain volume by accepting the flow of molten metal out of surrounding fibers. If sufficient metal is removed from these fibers, in the oven during thermoforming (i.e. the beads become very large), the result will be either fiber rupture or at least reduced fiber cross section, with either condition reducing EMI shielding in those areas.

The appearance of metal beads was avoided in Examples 2–4. This shows the improvement provided by protecting the metal mat by overcoating or substantially embedding it in a polymer fiber-coat matrix before heating and shaping. Table 1 shows the results of testing composite sheets of the invention to determine incidence of metal bead formation and EMI shielding efficiency.

Examples 1, 2, 3 and 4 the thermoformable composite comprised 30 cm×30 cm polycarbonate sheets laminated to 20 cm×20 cm EMI shielding sheets of the invention.

Example 4, having an adhesive coating over the metal fiber mat, may be adhesively attached and is capable, where needed, of establishing electrical connection with a suitable ground plane. Housings thermoformed from Example 4, attached to conductive surfaces by pressure, provide connections with electrical resistance less than 100 milliohms between the metal fiber mat A and the conductive surface.

TABLE 1

Thermoformed Sheet Performance

| Example | Oven Dwell Time (minute) | EMI Shielding (db) | Metal Bead Formation |
|---|---|---|---|
| Example 1 | 0.46 | 20 | 7 beads |
| Example 2 | 0.46 | 45 | None |
| Example 3 | 0.59 | 50 | None |
| Example 4 | 0.46 | 50 | None |

Injection Molding of Composite Sheets and Thermoformed Preforms

EXAMPLE 5

A polycarbonate sheet of about 0.13 mm thickness (LEXAN 8010MC polycarbonate from GE Plastics-Structured Products) was coated with a thin layer of polyethylene using a 10% of VYTEL PE 200 in methyl ethyl ketone, using a #5 Meyer bar. After oven-drying these sheets at 105° C. for two minutes, a sample of metal fiber mat A was applied to the VYTEL PE 200 layer. The composite was protected on either side using multiple sheets of silicone release paper, then laminated for 10 seconds, using a heated platen press operating at about 340 Kgms and 127° C. Upon cooling, the resulting samples were overcoated by hand-held spray bottle, using a solution of 10% solids ADCOTE 37P295 wax dispersion in water to a wet coating weight from about 10 gms/100 $cm^2$ to about 30 gms/100 $cm^2$. The completed composite sheet was dried in an oven at a temperature of 105° C. for about 10 minutes.

Injection Molding of Example 5

A pre-formed insert was made from the material of example using the thermoforming equipment previously described. The top heater of the thermoformer was turned off and the bottom heater was set at 538° C. The sheet was heated before forming in the thermoforming oven for 0.23 minutes. The sheet of example 5 was formed into a substantially rectangular pre-form having dimensions of approximately 3.5 cm×9.8 cm×1.0 cm deep. This part was pre-formed to fit snugly inside an injection mold. The pre-form was then placed into one side of the injection mold (the side opposite the gate) which in turn was mounted in a 70 ton Arburg molding machine. The mold was closed and the cavity was injected with a full charge of Lexan 141R polycarbonate obtained from GE Plastics, having a melt temperature of 300° C. The injection rate was 20 cc/s, the mold temperature was 40° C., and the cool time was 15 s. The mold was opened after the part cycle was completed and the result was an injection molded part with a smooth inner surface including an electrically conductive network of tin bismuth alloy fibers having a surface resistance of less than 200 milliohms from corner to corner as measured using a Fluke Model 75 Multimeter obtained from John Fluke Mfg. Co. Inc.

EXAMPLE 6

Fiber mat A was spray overcoated using a 5% solution of PETG (KODAR 6763 from Eastman Chemical Co.) in methylene chloride. Spray application of the overcoat by a Binks spray gun with a #63B nozzle gave a wet coating weight of between about 20.0 g and about 30.0 g per 100 $cm^2$. After drying at room temperature, the resulting fiber mats were heat laminated onto a 0.13 mm thick PETG (KODAR 6763) plastic sheet for 5 seconds using a heated platen press as in Example 4.

Injection Molding of Example 6

A pre-formed insert was made from the material of example 6 using the thermoforming equipment previously described. The top heater of the thermoformer was set at 316° C. and the bottom heater was set at 260° C. The sheet was heated before forming in the thermoforming oven for 0.28 minutes. The sheet of example 6 was formed into a substantially rectangular pre-form having dimensions of approximately 3.5 cm×9.8 cm×1.0 cm deep. This part was pre-formed to fit snugly inside an injection mold. The pre-form was then placed into one side of the injection mold (the side opposite the gate) which in turn was mounted in a 70 ton Arburg molding machine. The mold was closed and the cavity was injected with a full charge of Vistolen P2000 polypropylene having a melt temperature of 240° C. The injection rate was 40 cc/s, the mold temperature was 40° C. and the cool time was 30 s. The mold was opened after the part cycle was completed and the result was an injection molded part with a smooth inner surface including an electrically conductive network of tin/bismuth alloy fibers having a surface resistance of less than 200 milliohms from corner to corner as measured using a Fluke Model 75 Multimeter obtained from John Fluke Mfg. Co. Inc.

EXAMPLE 7

Composite sheets were prepared as described in Example 5 except the overcoat of ADCOTE 37P295 was omitted. This was not needed since the material did not require thermoforming prior to molding.

Injection Molding of Example 7

The film composite of Example 7 was taped onto the female side of the injection mold. The mold was mounted in a 150 Ton Demag Ergo Tech 150610 injection molding machine. The mold was then closed around the film which resulted in an initial cold forming of the plastic/metal fiber composite. Cycoloy HF1120 ABS/Polycarbonate blend obtained from GE Plastics, having a melt temperature of 270° C., was then injected into the mold. The injection rate was 30 cc/s, the mold temperature was 40° C., and the cooling time was 15 s. The mold was opened after the part cycle was completed and the result was an injection molded part having dimensions of approximately 4.8 cm×9.7 cm×0.4 cm with a smooth inner surface including an electrically conductive network of tin bismuth alloy fibers having a surface resistance of less than 200 milliohms from corner to corner as measured using a Fluke Model 75 Multimeter obtained from John Fluke Mfg. Co. Inc.

EXAMPLE 8

Composite sheets were prepared as described in Example 6 except the overcoat of PETG was omitted. This was not needed since the material did not require thermoforming prior to molding.

Injection Molding of Example 8

The film composite of Example 8 was taped onto the female side of the injection mold. The film was preheated on the mold using a hand held heat gun for approximately 15 seconds. The mold was then closed around the film which resulted in an initial cold forming of the plastic/metal fiber composite. The mold was closed and the cavity was injected with a full charge of Cycoloy HF1120 ABS/Polycarbonate blend obtained from GE Plastics, having a melt temperature of 270° C. The injection rate was 30 cc/s, the mold temperature was 70° C., and the cooling time was 15 s. The mold was opened after the part cycle was completed and the result was an injection molded part having dimensions of approximately 4.8 cm×9.7 cm×0.4 cm with a smooth inner surface including an electrically conductive network of tin bismuth alloy fibers having a surface resistance of less than 200 milliohms from corner to corner as measured using a Fluke Model 75 Multimeter obtained from John Fluke Mfg. Co. Inc.

EXAMPLE 9

A polycarbonate sheet of about 0.13 mm thickness (LEXAN 8B35 polycarbonate from GE Plastics-Structured Products) was coated, by lamination, with a layer of ethylene methyl acrylate copolymer (EMAC SP2207 from Chevron Chemical Co.—Specialty Polymers), about 0.10 mm thick. The lamination step used a heated platen press operating at 22,000 Kgf pressure for about 20 s at 125° C.

Metal fiber mat A, was placed on the EMAC SP2207 layer. The composite was protected on either side using multiple sheets of silicone release paper, then laminated for 20 s, using a heated platen press operating at about 25,000 Kgf and 110° C.

Injection Molding of Example 9

A pre-formed insert was made from the material of example 9 using the thermoforming equipment previously described. The top heater of the thermoformer was turned off and the bottom heater was set at 538° C. The sheet was heated before forming in the thermoforming oven for about 0.3 minute. The sheet of example 9 was formed into a substantially rectangular pre-form having dimensions of approximately 4.8 cm×9.7 cm×0.4 cm deep. This part was pre-formed to fit snugly inside an injection mold. The pre-form was then placed into one side of said injection mold (the side opposite the gate) which in turn was mounted in a 70 ton Arburg Allrounder 700-230-305 ECO molding machine. The mold was closed and the cavity was injected with a full charge of LEXAN 940 polycarbonate, obtained from GE Plastics, having a melt temperature of 300° C. The injection rate was about 20 cc/s, the mold temperature was about 90° C., and the cooling time was about 15 sec. The mold was opened after the part cycle was completed and the result was an injection molded part with a smooth inner surface including an electrically conductive network of tin bismuth alloy fibers having a surface resistivity of less than 200 milliohms from corner to corner as measured using a Fluke Model 75 Multimeter obtained from John Fluke Mfg. Co. Inc.

A second sample of a preform of Example 9, made as described previously, was placed, as a preformed insert, in a mold attached to a 70 ton Arburg Allrounder 700-230-305 ECO injection molding machine. After closing, the mold cavity was filled by injection with a full charge of ABS-polycarbonate blend (Cycoloy C1200HF, obtained from GE Plastics) having a melt temperature of about 270° C. At a mold temperature of about 40° C. the resin injection rate was about 20 cc/s followed by cooling for about 15 s. The injection molded part had the same performance as the molding produced with LEXAN 940.

EXAMPLE 10

A polycarbonate sheet, about 0.13 mm thick, (LEXAN 8B35 available from GE Plastics—Structured Products) was coated on both sides, by laminating about 0.10 mm of ethylene methyl acrylate copolymer (EMAC SP2207 available from Chevron Chemical Co.—Specialty Polymers) using a platen press operating at about 22,000 Kgf for about 20 s and at a temperature of about 125° C.

Metal fiber mat A was placed against one of the layers of EMAC SP 2207 before placing the composite between multiple sheets of silicone release paper then applying pressure using a heated platen press at 25,000 Kgf for about 20 s. at about 110° C.

Injection Molding of Example 10

A pre-formed insert was made from composite sheets of Example 10 as previously described for Example 9. The preform was placed in a mold attached to a 70 ton Arburg Allrounder 700-230-305 ECO injection molding machine.

After closing, the mold cavity was filled by injection with a full charge of high density polyethylene (Petrothene LM6187, available from Quantum Co.) having a melt temperature of about 210° C. With mold temperature held at room temperature, the resin injection rate was about 20 cc/s followed by cooling for about 20 s. The resulting part showed good adhesion between the polyethylene and the preformed insert and had a smooth inner surface including an electrically conductive network of tin busmuth alloy fiber with a surface resistivity less than 200 milliohms measured using a Fluke Model 75 Multimeter obtained from John Fluke Mfg. Co. Inc.

What is claimed is:

1. A shaped article shaped by thermoforming of a planar sheet, said shaped article having a shape requiring said planar sheet to exhibit a stretch ratio of at least about 300%, said article comprising:

a shield for electromagnetic interference consisting essentially of a unitary fibrous metal mat, including fused metal fiber-to-fiber contacts, said mat comprising a low melting metal or metal alloy having a melting point in the range from about 70° C. to about 370° C., said metal mat being substantially surrounded by a thermoplastic coating, said metal mat further being supported by a non-porous carrier sheet, said shaped article being substantially free from metal bumps and metal mat gaps.

2. A shaped article according to claim 1 wherein said metal mat is formed from a metal or metal alloy having a melting point lower than the softening points of either said non-porous sheet or said thermoplastic coating.

3. A shaped article according to claim 1 wherein said thermoplastic coating and said carrier sheet are formed of different materials.

4. A shaped article according to claim 1 wherein said shape requires said planar sheet to exhibit a stretch ratio of about 500%.

5. A shaped article according to claim 1 wherein said thermoplastic coating was applied to said fibrous metal mat prior to attachment to said carrier sheet.

6. A shaped article according to claim 5 wherein said thermoplastic coating was applied by spraying.

7. A shaped article according to claim 1 wherein said thermoplastic coating is a thermoplastic resin selected from the group consisting of ethylene-butyl acrylate copolymers, ethylene-vinyl acetate copolymers and dispersions thereof, ethylene-methacrylic acid copolymers; thermoplastic polyesters, polyamides, acrylic adhesives, hot melt adhesives, block copolymers, polyurethanes, polyethylenes, polypropylenes, grafted polymers and copolymers, functionalized copolymers, maleic anhydrides, acrylic acid modified copolymers, polyesters, copolyesters, latex binders, polyurethane dispersions, styrene-ethylene butylene-styrene copolymers, and paraffin wax.

8. A shaped article according to claim 7 wherein said thermoplastic coating is ethylene vinyl acetate.

9. A shaped article according to claim 1 wherein said fibrous metal mat was attached to said carrier sheet prior to the application of said thermoplastic coating.

10. A shaped article according to claim 9 wherein said carrier sheet is attached to said fibrous metal mat by means of pressure or heat.

11. A shaped article according to claim 1 wherein said carrier sheet is selected from the group consisting of acrylonitrile, butadiene styrene, polycarbonate, cellulosic materials, ethylene-butyl acrylate copolymers, ethylene-vinyl acetate copolymers and dispersions thereof, ethylene-methacrylic acid copolymers; thermoplastic polyesters, polyamides, acrylic adhesives, hot melt adhesives, block copolymers, polyurethanes, polyethylenes, polypropylenes, grafted polymers and copolymers, functionalized copolymers, maleic anhydrides, acrylic acid modified copolymers, polyesters, copolyesters, latex binders, polyurethane dispersions, styrene-ethylene butylene-styrene copolymers, and paraffin wax.

12. A shaped article according to claim 11 wherein said thermoplastic coating is an acrylic adhesive.

13. A shaped article according to claim 12 wherein said acrylic adhesive contains microspheres.

14. A shaped article according to claim 1 wherein said thermoplastic coating and said carrier sheet are an acrylic adhesive.

15. A composite thermoformable planar sheet consisting essentially of a non-porous carrier sheet with a metal fiber mat of randomly oriented, low melting metal fibers, as a shield for electromagnetic interference, said metal fiber mat being substantially surrounded by a thermoplastic fiber-coat material, said fiber-coat material being attached prior to or after attachment of said low melting metal fibers to the non-porous carrier sheet, said composite thermoformable planar sheet being capable of being formed into a shaped article having fused metal fiber-to-fiber contacts.

16. A shaped article having been formed by insert injection molding, said shaped article having as an integral portion an EMI shield, consisting of a composite, sheet consisting essentially of a non-porous carrier sheet with a mat of randomly oriented, low melting metal fibers, said mat of randomly oriented, low melting metal fibers being substantially surrounded by a thermoplastic coating material, said thermoplastic coating material being attached prior to or after attachment of the metal fibers to said non-porous sheet, said EMI shield including fused metal fiber-to-fiber contacts said composite sheet fashioned from a planar sheet into said integral portion of said shaped article by inserting said planar sheet into the injection molding mold before infecting resin therein.

* * * * *

UNITED STATES PATENT AND TRADEMARK OFFICE
CERTIFICATE OF CORRECTION

PATENT NO.: 6,013,376

DATED: January 11, 2000

INVENTOR(S): Donald M. Yenni, Jr.

It is certified that error appears in the above-identified patent and that said Letters Patent is hereby corrected as shown below:

Column 1, Line 56, "3,272,292" should read --3,727,292--.

Column 1, Line 57, "4,689,089" should read --4,689,098--.

Column 14, Line 51, "infecting" should read --injecting--.

Signed and Sealed this

Fifteenth Day of May, 2001

Attest:

NICHOLAS P. GODICI

Attesting Officer

Acting Director of the United States Patent and Trademark Office